United States Patent [19]
Nicolas

[11] 4,023,115
[45] May 10, 1977

[54] MEANS FOR CONTROLLING THE PHASE OR FREQUENCY OUTPUT OF AN OSCILLATOR IN A LOOP CIRCUIT

[75] Inventor: Michel Jacques Robert Nicolas, Paris, France

[73] Assignee: Societe Nationale d'Etude et de Construction de Moteurs d'Aviation, Paris, France

[22] Filed: July 31, 1975

[21] Appl. No.: 600,779

[52] U.S. Cl. .................................. 331/17; 331/23; 331/25
[51] Int. Cl.² .......................................... H03B 3/04
[58] Field of Search ................ 331/17, 18, 23, 25; 329/122, 124, 125; 325/419, 423

[56] References Cited
UNITED STATES PATENTS
2,930,001  3/1960  Salmet ............................ 331/19 X Primary Examiner—Siegfried H. Grimm
Attorney, Agent, or Firm—Watson, Cole, Grindle & Watson

[57] ABSTRACT

A device for controlling, by means of a phase comparator which receives an input signal, the phase or frequency output of a voltage controlled oscillator connected with the phase comparator in a phase locked loop, this loop being also provided with a branch circuit including a high pass filter or appropriate characteristics.

6 Claims, 6 Drawing Figures

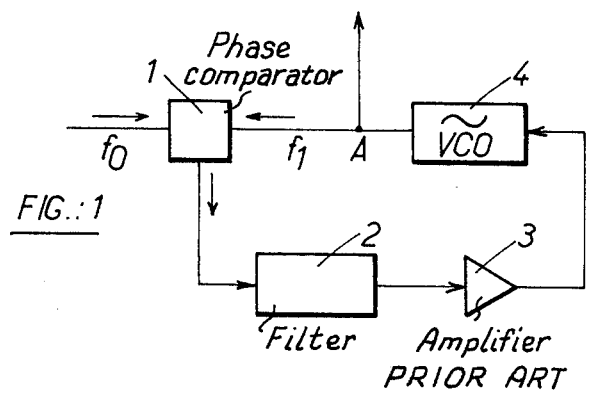
FIG.:1 PRIOR ART
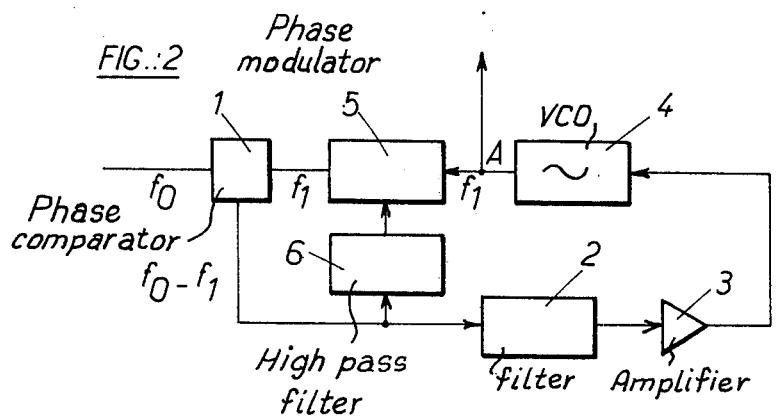
FIG.:2
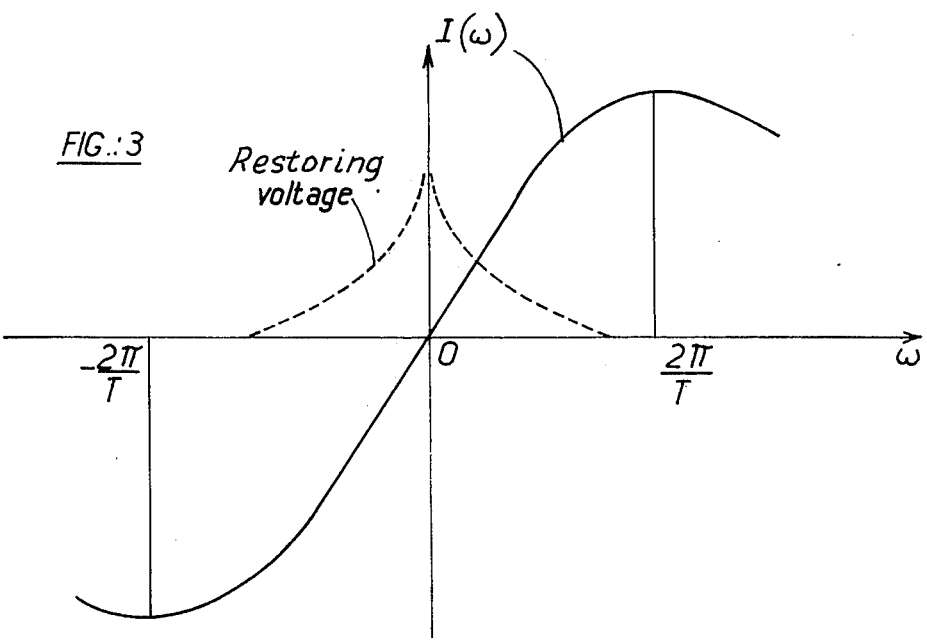
FIG.:3

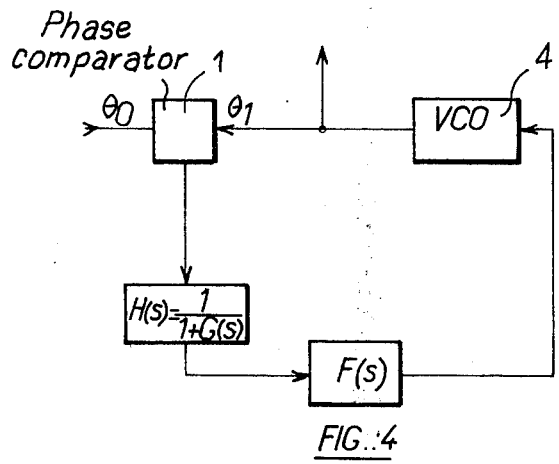
FIG.:4
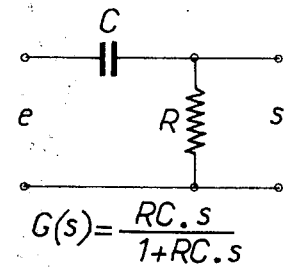
$$G(s) = \frac{RC \cdot s}{1 + RC \cdot s}$$
FIG.:5
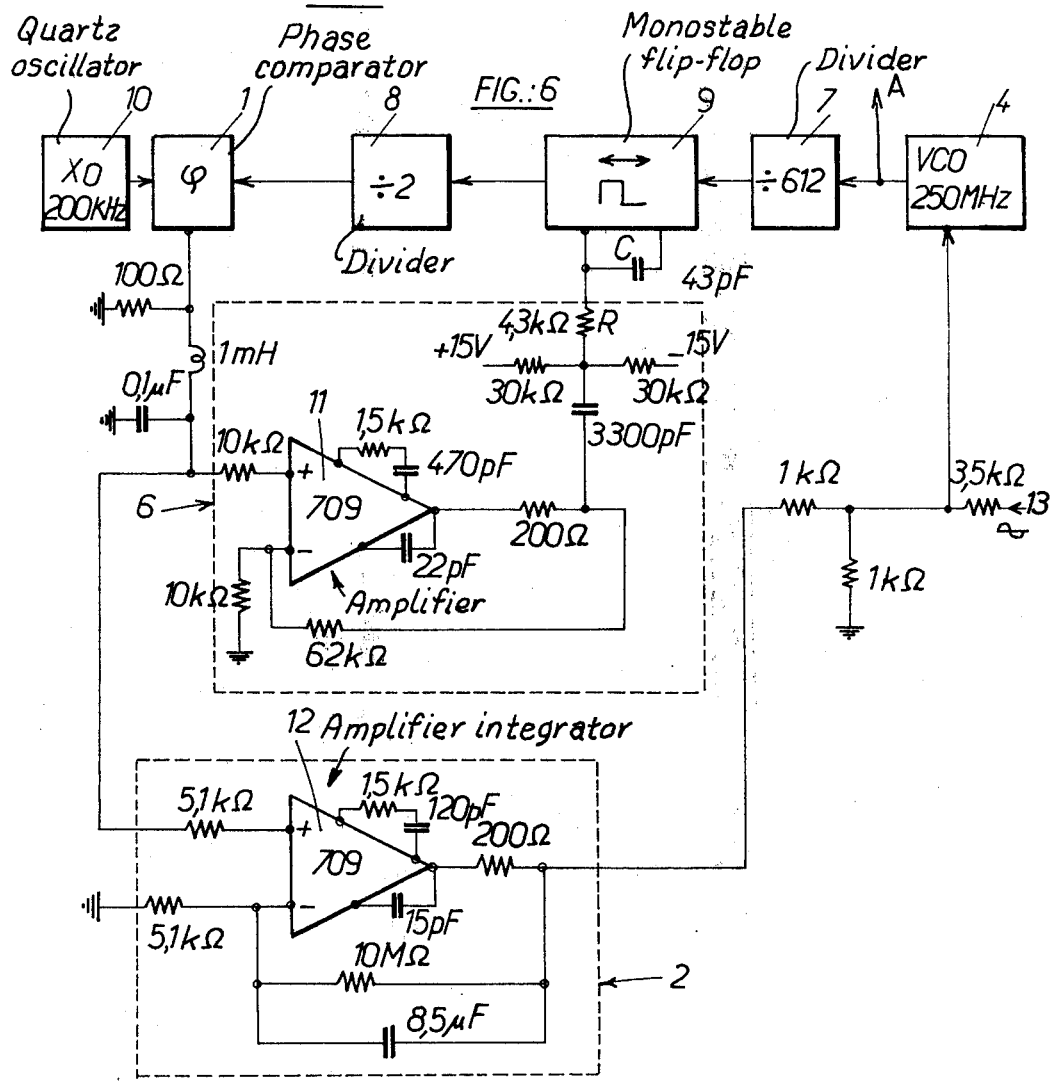
FIG.:6

MEANS FOR CONTROLLING THE PHASE OR FREQUENCY OUTPUT OF AN OSCILLATOR IN A LOOP CIRCUIT

The present invention relates to demodulator and oscillator electronic circuits, and more specifically to a device for controlling phase or frequency. It is particularly concerned with the provision of a phase-locking loop for controlling an oscillator in response to an input signal applied to the loop.

Such a device can be used advantageously in numerous electronic transmitter and receiver circuits, especially for filtering a signal with a slow variation in frequency (due, for example, to the Doppler effect) or with a rapid variation (phase or frequency demodulator), for stabilizing the frequency of an oscillator in the presence of noise, for demodulation of frequency-modulated waves, FSK demodulation, implementing a frequency synthesizer, a device for controlling the speed of a motor, etc..

Such a phase-locking loop is known per se and usually includes a phase comparator, a filter, an amplifier and the oscillator to be controlled connected in a closed-loop circuit. Reference may be made for example to Floyd M. Gardner, "Phaselock Techniques", published by John Wiley & Sons, or to Viterbi, "Principles of Coherent Communication" published by McGraw Hill.

According to the invention, there is provided apparatus for controlling, by means of a phase comparator which receives an input signal applied to a first input thereof and arranged to compare the input signal with the output signal of a voltage controlled oscillator, the output signal. The circuitry includes a filter, the voltage controlled oscillator, a phase modulator and the second input of the phase comparator. The phase modulator is arranged to modulate the output voltage of the oscillator and to apply it to the comparator. A branch circuit includes a high pass filter with limited phase splitting connected between the control input of the phase modulator and the output of the comparator. The high pass filter has a transfer function such that the imaginary component thereof is not cancelled out until the difference in frequencies of the signals applied to the comparator is nil.

The invention will be better explained and understood from the following description given by way of example with reference to the accompanying drawings, in which:

FIG. 1 is a schematic diagram of known control apparatus,

FIG. 2 is a schematic diagram of control apparatus according to the invention,

FIG. 3 is a graph illustrating the desired characteristics of a filter forming part of the apparatus shown in FIG. 2, FIG. 4 is an equivalent circuit diagram similar to FIG. 2, FIG. 5 is a circuit diagram of the high pass filter, and FIG. 6 is a more detailed circuit diagram of the apparatus shown in FIG. 2.

FIG. 1 shows a known phase-locking loop. A phase comparator 1 receives the controlling input signal, at a frequency $f_0$, on its left input, and the signal circulating in the loop at a frequency $f_1$, on its right input. The loop is a closed loop comprising, besides the comparator 1, a filter 2, an amplifier 3, a variable frequency, and voltage controlled oscillator 4 (VCO). The aim is to adjust the frequency of the loop so that the frequency $f_1$ becomes synchronised with the frequency $f_0$. The output signal from the loop is produced, for example at A, at the output of the oscillator 4.

The loop filter 2, which is of the low pass type, is often formed by a "leaky" integrator, with a transfer function $$F(S) = \frac{s\tau_2 + 1}{s(\tau_1 + \tau_2) + 1}$$

where S is the complex Laplace variable and $\tau_1$ and $\tau_2$ are the time constants. (See Gardner supra, chapter 2—2 "Second order loop", page 9).

In order to fully understand the principle of the invention, it is useful to remember the manner of operation of the control loop; three cases may be distinguished as follows:

1. If $f_1$ is about equal to $f_0$, the loop is quickly synchronized, phase splitting between the frequency signals $f_0$ and $f_1$ always remaining less than 180°. This is the case, in practice, when the difference $f_1 - f_0$ is substantially lower than the band width of the loop (or correct frequency, fn). This is the "area of synchronization".

2. If the difference $f_1 - f_0$ is greater than the band width of the loop and lower than a certain limit defining the "area of capture", the phase difference between $f_1$ and $f_0$ varies continuously taking values equal to a large multiple of 360°.

3. If $f_1 - f_0$ is higher than the frequency limit of the area of capture, synchronization of the loop does not occur.

The invention mainly improves the operation of the loop, at least in case (2), during the synchronizing phase (by enlarging the area of capture as well as increasing the speed of frequency re-adjustment of the oscillator) and the latter without using additional multiple filter circuits to mitigate the poor frequency attainment qualities of the phase locking device with classic means (see for example Viterbi, supra, page 73).

For this purpose, in accordance with the invention, the above-described known phase-locking loop including a phase comparator, a filter, an optional amplifier and the oscillator to be controlled, is modified by the insertion into the loop of a phase modulator capable of modulating the output voltage of the oscillator in the loop and a branch circuit including a high pass filter is connected between the control input of the phase modulator and output of the phase comparator. The characteristics of the high pass filter are chosen so that the modulator almost stops intervening once synchronization of the loop has occurred. For this purpose, the high pass filter is preferably of the first order, with limited phase splitting and having a transfer function such that the imaginary component thereof is not cancelled out until the difference $(f_1 - f_0)$ in the frequencies of the signal and the oscillator is nil.

FIG. 2 shows the basic construction of a control device according to the invention. The same reference numerals have been used to designate those elements which are identical with elements of FIG. 1. It can be seen that the apparatus shown in FIG. 2 differs from that shown in FIG. 1 by the presence of a phase modulator 5 and a filter 6. The phase modulator 5 is placed between the phase comparator 1 and the oscillator 4, to modulate the output voltage of the oscillator 4. The filter 6 is a supplementary filter, forming a branch of the loop, connecting the output of the phase comparator to the control input of the phase modulator. The construction of the filter 6 is chosen to provide a transfer function G(s) which will be set out in greater detail below.

First of all the desired operation of the device to control the phase will be described.

If it is supposed that initially the frequency $f_1$ which is phase modulated and applied to one input of the comparator 1, is displaced in relation to the frequency $f_0$ of the signal applied to the other input of the comparator 1, then the output of the phase comparator comprises a beat signal with a frequency of $f_0 - f_1$.

Thus, the output signal of the VCO 4, which has frequency $f_1$, is phase modulated in the modulator 5 by a signal $f_0 - f_1$. The resulting signal comprises a carrier $f_1$ and two side-bands:

$$f_1 + (f_0 - f_1) = f_0$$
$$f_1 - (f_0 - f_1) = 2f_1 - f_0$$

It is seen that one of the side-bands has a frequency equal to the frequency of the signal $f_0$. If the phase comparator receives on its two inputs signals of equal frequency, it will provide a continuous voltage at its output.

If the filter 6 is judiciously chosen with regard to its characteristics of phase and cut-off, the above continuous voltage is proportional, in magnitude and direction, to the frequency difference $f_0 - f_1$. It therefore constitutes a restoring voltage for the oscillator 4 allowing rapid frequency attainment.

Calculation shows that in practice a 1st order high pass filter (imperfect diverter) is quite suitable.

It remains to examine the characteristics which the filter 6 of the branch circuit requires to enable it to perform the function required by the invention.

Generally, the transfer function G ($\omega$) of any filter, ($\omega$ being the pulsation corresponding to the frequency $f$), can be split into a real part R ($\omega$) and an imaginary part I ($\omega$) such that:

$$G(\omega) = R(\omega) + j \cdot I(\omega)$$

Thus, the calculation shows that the imaginary part is the continuous component voltage at the output of the phase comparator and thus is the component which controls the variable oscillator.

Even more precisely, this continuous component is proportional to I ($\omega_0 - \omega_1$), $\omega_0$ and $\omega_1$ corresponding respectively to the frequencies $f_0$ and $f_1$.

It is desirable that the curve representing the variation of I ($\omega$) should have substantially the form shown in FIG. 3, that is to say particularly:

that this curve cuts the abscissa only at the origin (if not there would be instability of the control loop or incorrect points of equilibrium), that I ($\omega$) does not increase indefinitely with $\omega$ on either side of the origin (so as to avoid phase splitting, which is caused by the phase modulator, taking too large a value).

It has been found in accordance with a feature of the invention that a 1st order filter satisfies these conditions. The construction of such a filter is relatively simple and therefore advantageous.

In this case it is possible to have:

$$G(s) = \frac{Ts}{1 + Ts}$$

which gives $$I(\omega) = \frac{\omega T}{1 + \omega^2 T^2}$$

Referring to FIG. 3, $\omega$ shows the variation in frequencies of the signal and of the voltage of the oscillator where:

$$\omega = 2\pi (f_0 - f_1)$$

The curve I ($\omega$), which gives the restoring voltage as a function of the variation, has the classic character of a frequency discriminator, in which the practical area of operation, between the maximum and the minimum of the curve, is $$\Delta\omega = \pm \frac{2\pi}{T}.$$

The 1st order filter can be a phase advance filter in which $$G(S) = \frac{1 + T_1 s}{1 + T_2 s}$$

where $T_1$ and $T_2$ represent the time constants characteristic of this filter ($T_1 >> T_2$). Therefore $$I(\omega) = \frac{\omega (T_1 - T_2)}{1 + \omega^2 T_2^2}$$

Generally, a filter of a higher order than the first is not suitable, because the numerator of the function I ($\omega$) will then be a polynomial of a higher order than 1, and consequently may have real roots other than at the origin, corresponding to some supplementary intersections on the abscissa.

If there is no intervention by the filter 6, attainment of phase locking will take place due to a restoring voltage caused by the modulation of the frequency of the oscillator 4. This restoring voltage can be calculated (see Gardner, supra, p. 44–46 and 86–87). Its variation has the form shown in dotted lines in FIG. 3. The restoring voltage diminishes when the difference in frequency increases, that is to say that locking the phase loop becomes difficult.

Thus, the branch circuit facilitates attainment of phase locking; moreover, it can be seen that it does not disturb operation of phase locking, once synchronization is achieved. In this case the phase comparator operates in the linear mode (see Viterbi, supra, p. 17) and the circuit of FIG. 2 can be replaced by the equivalent circuit of FIG. 4, with:

$\theta_0$, input signal phase, $\theta_1$, oscillator VCO signal phase, that is to say a simple loop in which has been inserted a filter with a transfer function:

$$H(S) = \frac{1}{1 + G(s)}$$

If one takes:

$$G(S) = K \frac{Ts}{1 + Ts}$$

one gets:

$$H(s) = \frac{1 + Ts}{1 + (K + 1) Ts}$$

If the gain K of the secondary loop is given a relatively low value (for example K = 0.3), H(S) is seen to be little different from 1 for operation in the area of synchronization.

Thus, the branch circuit becomes almost inactive when synchronization takes place; it does not substantially modify the stability of the control, nor its filtering characteristics relative to noise, nor its dynamic response.

A device in accordance with the invention can be implemented using conventional elements. The high pass filter 6 can be a simple RC network as shown in FIG. 5. The phase modulator can be a "varicap" diode with variable capacity inserted into a resonating circuit.

FIG. 6 shows the implementation of the invention for a particular application related to the stabilization of a telemetry transmitter which is frequency modulated.

A phase comparator 1 receives on its left input the signal of a quartz oscillator 10 having a frequency of 200 kHz and on its right input the signal which circulates in the loop.

The output of the controlled oscillator 4, the frequency of which is about 250 MHz, is divided by a factor 2 × 612 = 1224 in two successive dividers 7 and 8 separated by a monostable flip-flop 9, and then compared with the output of a quartz oscillator 10 of 200 kHz frequency in the comparator 1. The oscillator 4 has a modulation input 13.

The monostable 9 (integrated circuit 54 121) serves as the phase modulator 5 in which the duration of the reply impulse is controlled by the output of the filter 6. The latter is a 1st order RC filter (C = 3300 pF, R = 4.3 KΩ) preceded by an amplifier 11 (integrated circuit μA 709).

The low pass filter 2 of the main loop F (s) is formed by an amplifier integrator 12 (with a resistance of 10 MΩ, and a capacity of 8.5 μF).

The purpose of frequency dividers (2 × 612) is to reduce the index of modulation so as to almost suppress the modulation side-bands and thus to allow control of the controlled oscillator with a quartz oscillator.

The same phase control device according to the invention can operate equally as a frequency control device, in the same way as a phase discriminator can operate as a frequency discriminator.

I claim:

1. A device for controlling the phase or frequency output of an oscillator by an input signal, comprising a voltage controlled oscillator, a phase comparator with two inputs and one output, means for applying said input signal to an input of said comparator, a phase modulator, means including said phase modulator for applying the output signal of said voltage controlled oscillator to the other input of said comparator, a filter, connection means including the above cited means for establishing in the order named a phase locked loop comprising said comparator and, beginning from the output of said comparator, said filter, said voltage controlled oscillator, said phase modulator and said other input of said phase comparator, said phase modulator being arranged to modulate the output voltage of the oscillator and to apply it to said comparator, a high pass filter, with limited phase rotation and with means for connecting the same as a branch circuit between the control input of said phase modulator and the output of said comparator, said high pass filter having a transfer function such that the imaginary component thereof is not cancelled out until the difference in frequencies of the signals applied to said comparator is nil.

2. A device as claimed in claim 1, wherein said connection means comprise at least one amplifying stage.

3. A device according to claim 1, wherein said high pass filter of the branch circuit is of the 1st order.

4. Device according to claim 1, wherein the transfer function of said high pass filter is of the form:

$$G(s) = \frac{Ts}{1 + Ts}$$

where s is the complex Laplace variable and T is the time constant characteristic of the filter.

5. A device according to claim 1, wherein said high pass filter comprises a phase advance network having a transfer function of the filter of the form $$G(S) = \frac{1 + T_1 s}{1 + T_2 s}$$

where S is the complex Laplace variable and $T_1$, $T_2$ are the two time constants characteristic of this filter.

6. A device according to claim 1, wherein said high-pass filter comprises a resistance/capacitance network.

* * * * *